(12) United States Patent
Bakran et al.

(10) Patent No.: US 8,188,807 B2
(45) Date of Patent: May 29, 2012

(54) ATTENUATION ELEMENT

(75) Inventors: Mark-Matthias Bakran, Erlangen (DE); Andreas Holweck, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 380 days.

(21) Appl. No.: 12/526,381

(22) PCT Filed: Sep. 5, 2007

(86) PCT No.: PCT/EP2007/059286
§ 371 (c)(1),
(2), (4) Date: Aug. 7, 2009

(87) PCT Pub. No.: WO2008/098628
PCT Pub. Date: Aug. 21, 2008

(65) Prior Publication Data
US 2010/0026424 A1  Feb. 4, 2010

(30) Foreign Application Priority Data
Feb. 12, 2007 (DE) .......................... 10 2007 006 840

(51) Int. Cl.
*H01P 1/22* (2006.01)

(52) U.S. Cl. .................................................. 333/81 R

(58) Field of Classification Search ................. 333/81 R
See application file for complete search history.

(56) References Cited

U.S. PATENT DOCUMENTS

| 2,782,381 A | | 2/1957 | Dyke |
| 4,156,500 A | | 5/1979 | Ihara et al. |
| 4,724,406 A | * | 2/1988 | Lewis ............................ 333/12 |

FOREIGN PATENT DOCUMENTS

| BE | 796 906 A1 | 7/1973 |
| EP | 1 450 475 A1 | 8/2004 |
| FR | 2 815 768 A1 | 4/2002 |
| JP | 58 203238 A | 11/1983 |
| JP | 8 203574 A | 8/1996 |
| JP | 10 214713 A | 8/1998 |

* cited by examiner

*Primary Examiner* — Stephen Jones
(74) *Attorney, Agent, or Firm* — Henry M. Feiereisen; Ursula B. Day

(57) ABSTRACT

The invention relates to an attenuation element. According to the invention, this attenuation element has two rail pieces (46, 48) and two conducting pieces (50, 52), wherein a rail piece (46, 48) and a conducting piece (50, 52) each are electrically connected in parallel, wherein these rail pieces (46, 48) are spatially disposed in parallel at a distance from each other, and wherein the conducting pieces (50, 52) each are made of electrically highly conductive material, and the rail pieces (46, 48) each are made of an electrically poorly conductive material. In this manner, the high-frequency currents can be substantially attenuated in a rectifier having distributed intermediate voltage circuits without the power loss in the intermediate voltage circuit markedly increasing such that the capacitors (10, 12, 24, 28) of the rectifier having distributed intermediate voltage circuits no longer need to be oversized with regard to an RMS current of the intermediate voltage circuit of this rectifier.

5 Claims, 4 Drawing Sheets

US 8,188,807 B2

ATTENUATION ELEMENT

CROSS-REFERENCES TO RELATED APPLICATIONS

This application is the U.S. National Stage of International Application No. PCT/EP2007/059286, filed Sep. 5, 2007, which designated the United States and has been published as International Publication No. WO 2008/098628 and which claims the priority of German Patent Application, Serial No. 10 2007 006 840.0, filed Feb. 12, 2007, pursuant to 35 U.S.C. 119(a)-(d).

BACKGROUND OF THE INVENTION

The invention relates to an attenuation element.

Traction converters for electric locomotives frequently have converters with a plurality of distributed voltage intermediate circuits. An equivalent circuit diagram for such a traction converter is shown in more detail in FIG. 1. In this equivalent circuit diagram, each converter 2 or 4 has a grid-side and a load-side converter 6 and 8. The grid-side converter 6 provided is what is known as a four-quadrant controller (4QS), with the load-side converter 8 provided being a self-commutated pulse-controlled converter. On the DC voltage side, these two converters 6 and 8 in each converter 2 or 4 of the traction converter are connected in electrical parallel by means of an intermediate circuit capacitor 10 or 12 which may be designed from a multiplicity of capacitors. These intermediate circuit capacitors 10 and 12 of the traction converter are electrically connected to one another and to DC-voltage-side connections of each converter 2 and 4 of the traction converter by means of electrical connections 14 and 16, particularly busbars. These intermediate circuit capacitors 10 and 12 have an auxiliaries converter 18 connected in electrical parallel with them. In addition, there is a circuit breaker 22 in a connecting line 20 for the auxiliaries converter 18. The DC-voltage-side connections of the auxiliaries converter 18 have a capacitor 24 connected in electrical parallel with them. Likewise, the intermediate circuit capacitors 10 and 12 of the converters 6 and 8 have an acceptor circuit 26 connected in electrical parallel with them which is designed as a series resonant circuit and is attuned to the harmonics of the intermediate circuit. To this end, this acceptor circuit 26 has a capacitor 28, inter alia. This equivalent circuit diagram likewise reveals that the connection 14 between the two converters 2 and 4 of the traction converter can be isolated such that the acceptor circuit 26 remains connected in electrical parallel with the capacitor 10 or 12 of the converter 2 or 4. For this reason, two circuit breakers 30 and 32 are arranged in the connection 14.

The electrical connections 14 and 16, particularly busbars, have a direct current flowing through them for power transfer between the voltage intermediate circuits of the two converters 2 and 4 of the traction converter. Since the grid-side converter 6 of each converter 2 and 4 of the traction converter is in single-phase form, a current at twice the grid frequency additionally flows in the electrical connections 14 and 16. The leakage inductances of the electrical connections 14 and 16 result in a higher-order resonant circuit in conjunction with the intermediate circuit capacitors 10 and 12 and the capacitors 24 and 28. This resonant circuit is excited upon each switching operation by a converter valve in a converter 2 or 4 on the voltage intermediate circuit of the traction converter and results in lightly attenuated, high-frequency currents between the voltage intermediate circuits. These currents result in supplementary thermal loading of the intermediate circuit capacitors 10 and 12 and of the capacitor 24 in the auxiliaries converter 18.

FIG. 2 uses a graph to show individual capacitor currents $i_{C2}$, $i_{C4}$, $i_{CH}$ and $i_{CS}$ over frequency. This illustration reveals that in all capacitors 10, 12, 24 and 28 of the converters 2, 4 and 18 and of the acceptor circuit 26, current gain takes place when the higher-order resonant circuit is excited. At a frequency below a resonant frequency, the frequency components are evenly split over these capacitors 10, 12, 14 and 28. At the resonant frequency, the capacitor currents $i_{C2}$, $i_{C4}$, $i_{CH}$ and $i_{CS}$ are amplified, and at a frequency above the resonant frequency the capacitor currents $i_{C2}$, $i_{C4}$, $i_{CH}$ and $i_{CS}$ are affected by the excitation differently.

EP 1 450 475 A1 discloses a measure which can be used to attenuate oscillations in the voltage intermediate circuit of a voltage intermediate circuit converter. This measure is an attenuation network which is connected in electrical parallel with each energy store of this voltage intermediate circuit converter. This attenuation network comprises a capacitor and a resistor which is connected in series with this capacitor. To achieve a good action by this attenuation network, the connections to the intermediate circuit capacitor are in low-inductance form. To dissipate a power loss, the resistor in this attenuation network preferably has a separate resistor cooling system. In addition, it is advantageous if the value of the capacitor in the attenuation network is in the order of magnitude of 1.5 to 50 times greater than the value of the capacitor in the voltage intermediate circuit. This attenuation network can be used to reduce the oscillation by the current in the oscillation path, and to reduce the electrical and thermal loading on the capacitors and on further components of the voltage intermediate circuit converter.

FIG. 3 shows a more detailed illustration of the equivalent circuit diagram for the traction converter shown in FIG. 1 with two attenuation networks 34 and 36 from EP 1 450 475 A1. According to EP 1 450 475 A1, an attenuation network 34 or 36 needs to be connected in electrical parallel with the intermediate circuit capacitor of a voltage intermediate circuit converter. The capacitor 10 or 12 has the attenuation network 34 or 36 connected in electrical parallel with it. The attenuation network 34 or 36 has a capacitor 38 or 40 and a resistor 42 or 44 which are connected in electrical series.

FIG. 4 uses a graph to show the capacitor currents $i_{C2}$, $i_{C4}$, $i_{CH}$ and $i_{CS}$ over the frequency f. To be able to recognize the action of the two attenuation networks 34 and 36, the current profiles in FIG. 2 and the attenuated current profiles are shown together in this graph. The dashed profiles illustrate the current profiles $i_{C2}$, $i_{C4}$, $i_{CH}$ and $i_{CS}$ with attenuation. At frequencies f below the resonant frequency, these attenuation networks 34 and 36 exhibit no action. The action of attenuation networks 34 and 36 is also limited at the resonant frequency.

SUMMARY OF THE INVENTION

The invention is thus based on the object of developing the known converter with a plurality of distributed voltage intermediate circuits such that high-frequency currents are attenuated, on the one hand, but the power loss ends up being lower.

This object is achieved by virtue of an attenuation element according to the invention being incorporated into the known converter with a plurality of distributed voltage intermediate circuits.

By virtue of the attenuation element according to the invention having two current paths, namely one for the high-frequency current component and one for the direct current and a current component at twice the frequency, each current path can be optimized independently of the others. The current path for the high-frequency current component has low inductance, but is equipped with a relatively high electrical resistance, whereas the current path for the direct current and the current component at twice the frequency has higher inductance and is provided with a lower electrical resistance. As a result, the high-frequency current component is attenuated, on the one hand, and on the other hand the direct current and the current component at twice the frequency is limited to only a minimal extent, which means that the power loss in the voltage intermediate circuit of the known converter with a plurality of distributed voltage intermediate circuits rises to only a minimal extent.

In order to produce two current paths with these different conditions, a material which does not have good electrical conductivity is chosen for the first current path and a material with good electrical conductivity is chosen for the second current path. The material which does not have good electrical conductivity which is provided is high-grade steel, and the material with good electrical conductivity which is provided is copper. So that the first path has as low an inductance as possible, the invention involves the provision of two rail pieces which run parallel in space at a minimal interval from one another. By contrast, the second current path comprises two line pieces which are respectively connected in electrical parallel with a rail piece.

Since this attenuation element according to the invention has two rail pieces running parallel in space at a minimal interval, it can be integrated without great complexity into a rail system for a voltage intermediate circuit for a voltage intermediate circuit converter with distributed voltage intermediate circuits.

Further advantageous refinements of the attenuation element according to the invention can be found in the subclaims.

BRIEF DESCRIPTION OF THE DRAWING

To explain the invention further, reference is made to the drawing, which schematically illustrates an embodiment of an attenuation element according to the invention.

DETAILED DESCRIPTION OF PREFERRED EMBODIMENTS

Figure 1:
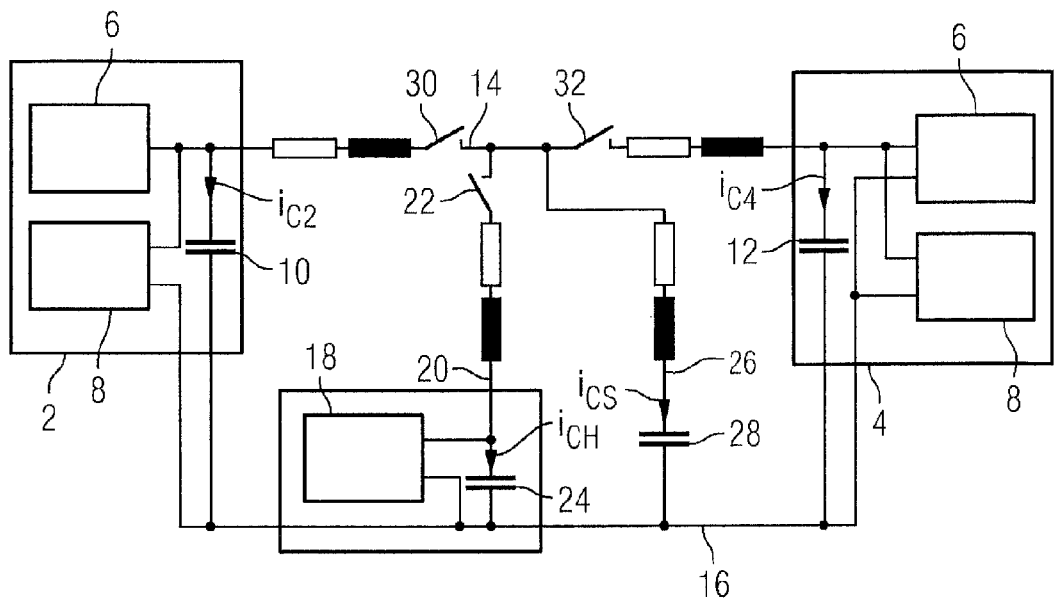
FIG. 1 shows an equivalent circuit diagram for a converter with distributed voltage intermediate circuits, FIG. 2 uses a graph to show various capacitor currents in the converter shown in FIG. 1 over frequency.
Figure 2:
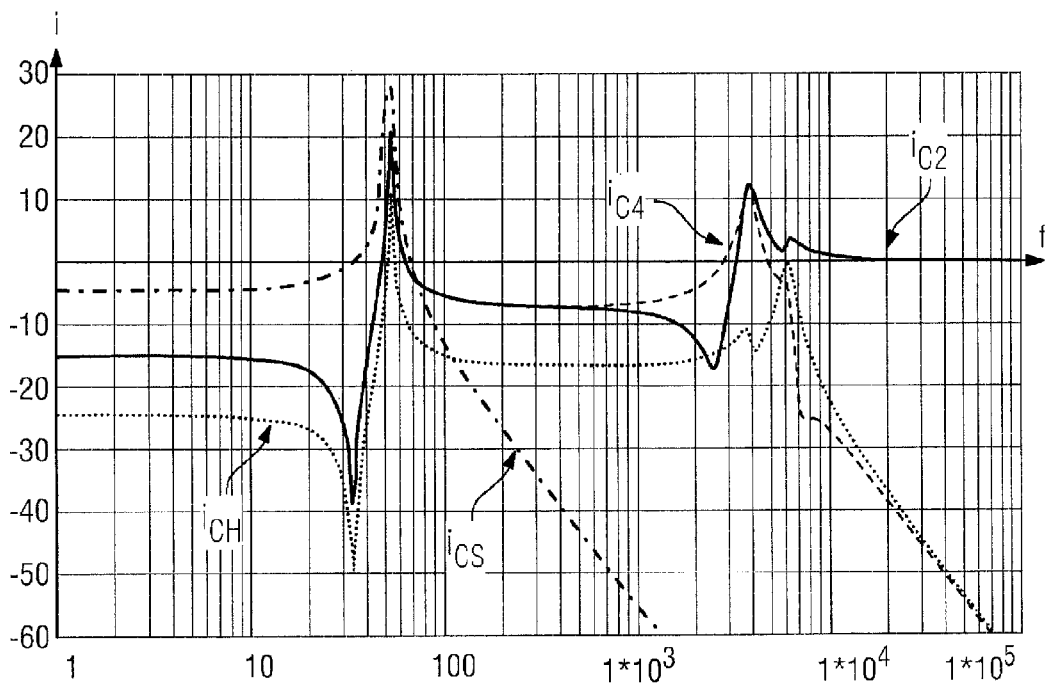
Figure 3:
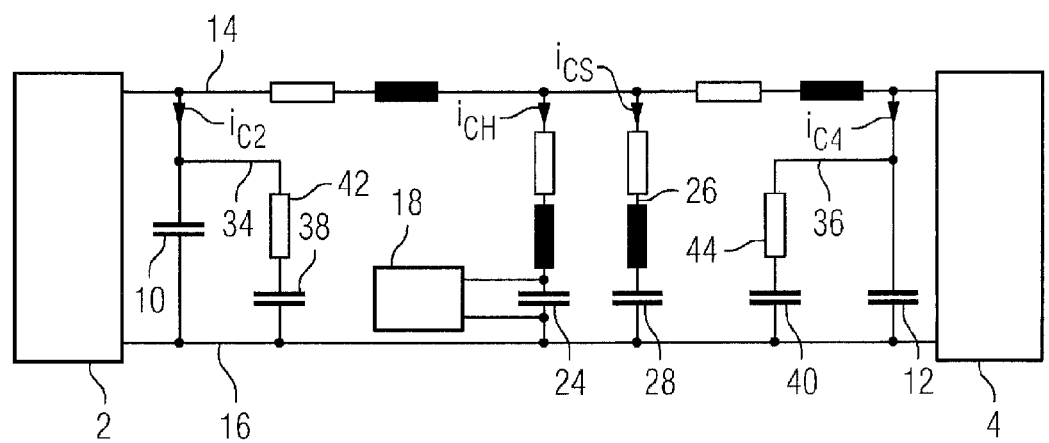
FIG. 3 shows an equivalent circuit diagram for the converter shown in FIG. 1 with known attenuation networks, wherein FIG. 4 uses a graph to illustrate various capacitor currents for the converter shown in FIG. 3 over frequency.
Figure 4:
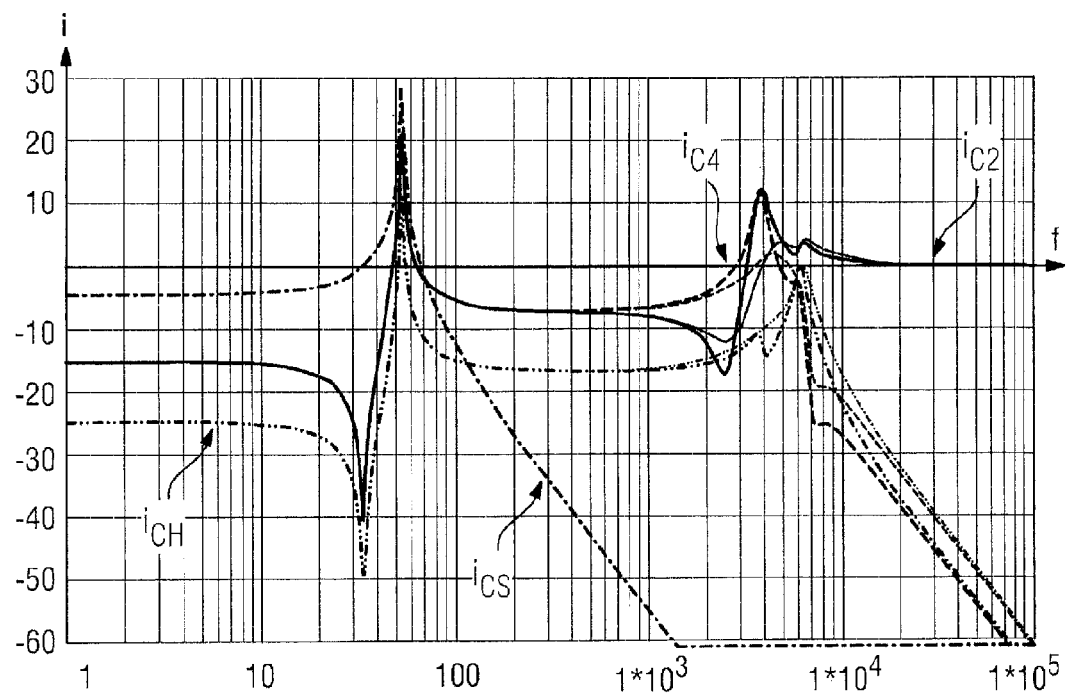
Figure 5:
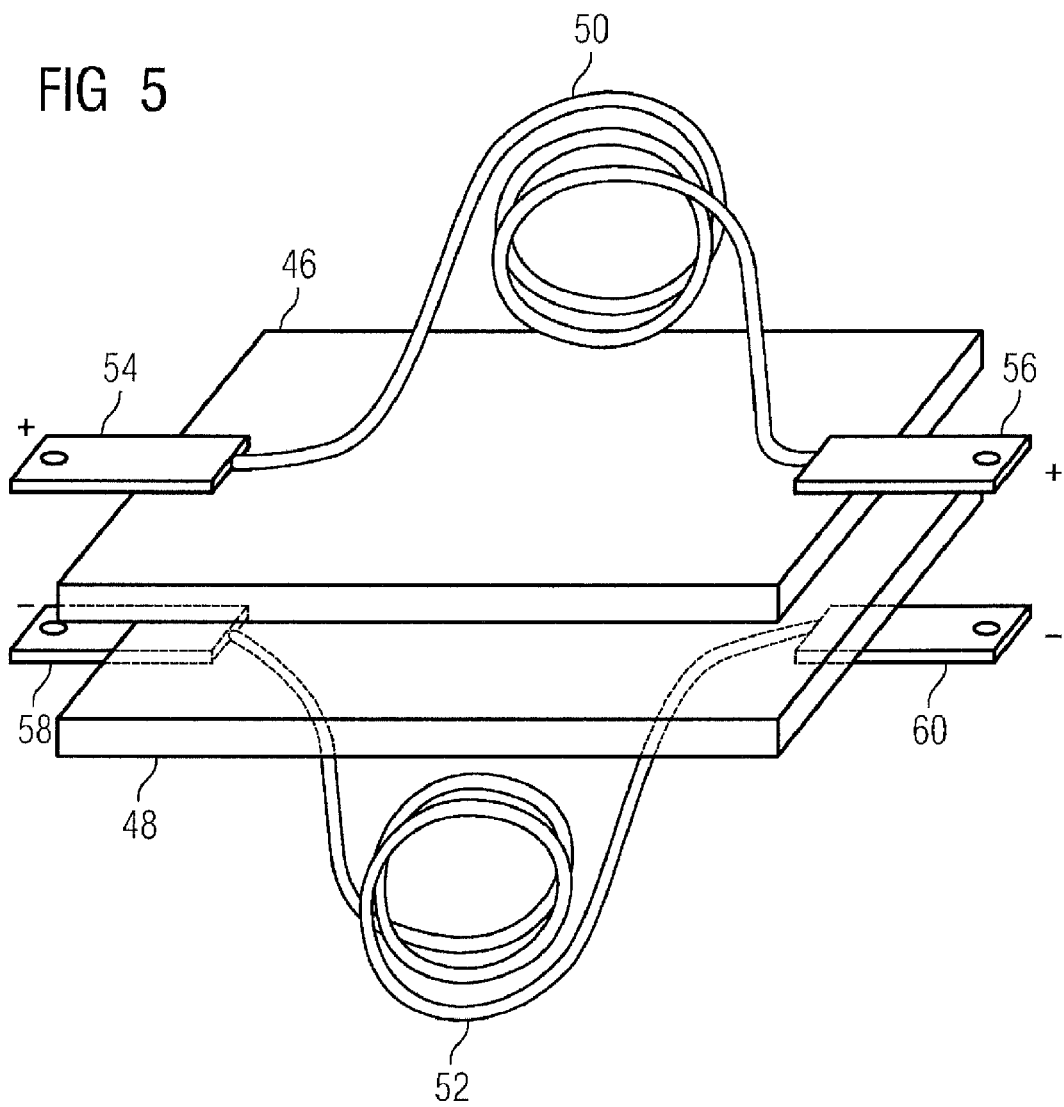
FIG. 5 shows an attenuation element according to the invention.

As shown in FIG. 5, an attenuation element according to the invention has two rail pieces 46 and 48 and two line pieces 50 and 52, with a rail piece 46 or 48 and a line piece 50 or 52 being respectively connected in electrical parallel. These two rail pieces 46 and 48 are arranged parallel in space at a minimal interval from one another. The value of this interval is determined by the limit values for clearances and creepage distances. A rail piece 46 or 48 and a line piece 50 or 52 are respectively connected in electrical parallel. Depending on a desired value for the inductance of the line piece 50 or 52 and hence for the second current path, this line piece 50 or 52 is in the form of a coil having at least one turn, particularly in the form of an air-core coil. Each end of a line piece 50 or 52 has a connecting piece 54, 56 or 58, 60 which are electrically conductively connected to the rail pieces 46 and 48. The rail pieces 46 and 48 respectively comprise high-grade steel, which means that the current path through these rail pieces 46 and 48 has a relatively high electrical resistance value. The interval between these two rail pieces 46 and 48 determines the inductance value of the current path through these rail pieces 46 and 48. For the line pieces 50 and 52, copper lines, particularly ribbon conductors comprising copper, are provided. As a result, the current path through these line pieces 50 and 52 has a relatively low resistance value. This form of the attenuation element provides two current paths, with a first current path having low inductance and a relatively high electrical resistance level, and with a second current path having relatively high inductance and a relatively low electrical resistance.

The configuration of the attenuation element means that the high-frequency current component in the intermediate circuit flows through the first current path, whereas the DC component and the current component of the intermediate circuit which is at twice the grid frequency flows through the second current path. Since only the first current path has a relatively high electrical resistance, only the current component flowing through this current path is attenuated. The current component which flows for the purpose of power transfer between the two voltage intermediate circuits of the converter with a plurality of distributed voltage intermediate circuits remains unaffected thereby, since it flows only in the second current path as a result of the inventive embodiment of the attenuation element. The use of rail pieces 46 and 48 for a current path for the attenuation element according to the invention means that this attenuation element can be integrated without great complexity into a rail system for the voltage intermediate circuit converter with a plurality of distributed voltage intermediate circuits, wherein the electrical connecting pieces 54, 58 and 56, 60 respectively produce the electrical connection between the rail pieces 46 and 48 and corresponding busbars in the rail system for a voltage intermediate circuit converter with distributed voltage intermediate circuits.

Figure 6:
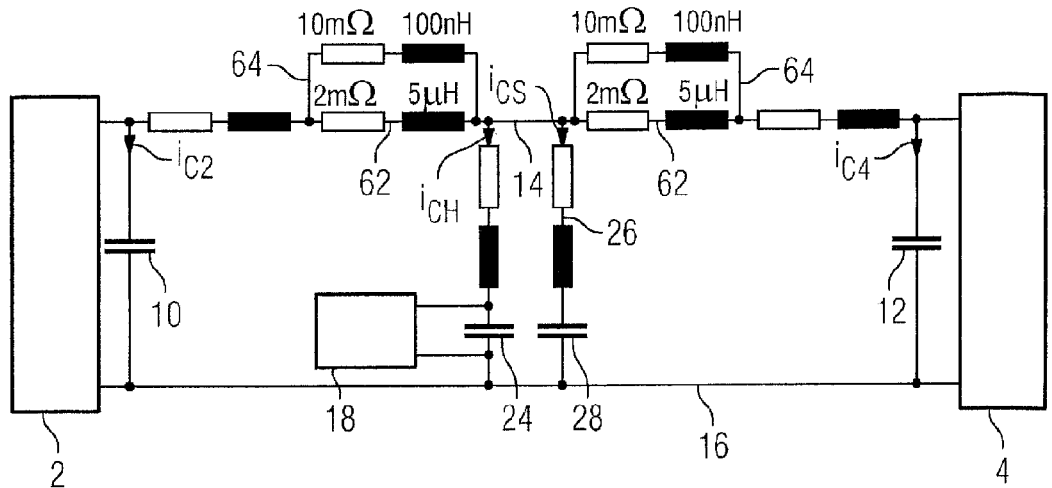
FIG. 6 shows an equivalent circuit diagram for the converter shown in FIG. 1 with an attenuation element as shown in FIG. 5, and FIG. 7 uses a graph to illustrate the capacitor currents of the converter shown in FIG. 6 over frequency.

An equivalent circuit diagram for a converter with two distributed voltage intermediate circuits and an attenuation element according to the invention is shown in more detail in FIG. 6. This equivalent circuit diagram shows the two current paths for the attenuation element according to the invention individually. The current path 62 with the relatively low resistance and the relatively high inductance is open to currents at low frequencies, whereas the current path 64 with the relatively high resistance and the relatively low inductance is open only to currents at relatively high frequencies. As a result, only the current component at relatively high frequencies is attenuated.

Figure 7:
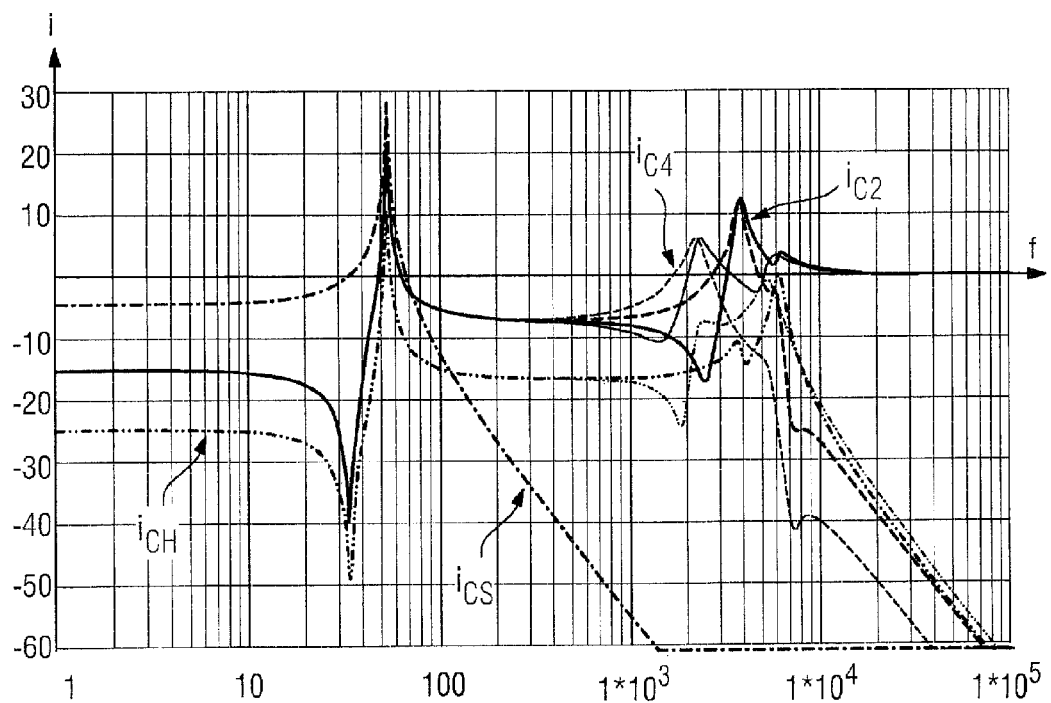

FIG. 7 uses a graph to illustrate the capacitor currents $i_{C2}$, $i_{C4}$, $i_{CH}$ and $i_{CS}$ of a converter with an attenuation element according to the invention over frequency f. The attenuated current profiles of the capacitor currents $i_{C2}$, $i_{C4}$, $i_{CH}$ and $i_{CS}$ are shown in dashes. In contrast to an embodiment of a converter with two distributed voltage intermediate circuits and two attenuation networks 34 and 36, the embodiment of this converter with one attenuation element according to the invention involves the current component at a relatively high frequency being attenuated much more. As a result, the capacitors 10, 12, 24 and 28 are subjected to much less additional thermal loading, which means that the respective capacitances of the capacitors 10, 12, 24 and 28 no longer need to be overproportioned in relation to the root-mean-square current of the voltage intermediate circuit of the converter with two distributed voltage intermediate circuits.

What is claimed is:

1. An attenuation element, comprising:
a first rail piece and a second rail piece electrically isolated from one another and made of a material having poor electrical conductivity spaced apart and running parallel in space at a distance selected so that the first and second rail piece in cooperation form a low-inductance conductor, and
a first line piece connected electrically in parallel with the first rail piece and a second line piece connected electrically in parallel with the second rail piece, said first and second line piece implemented as a coil having at least one turn and made of a material having good electrical conductivity, said first and second line piece each forming a high-inductance conductor with an inductance greater than an inductance of the low-inductance conductor.

2. The attenuation element of claim 1, further comprising connecting pieces, wherein each connecting piece connects a corresponding end of a line piece to a corresponding end of a rail piece.

3. The attenuation element of claim 1, wherein the first and second line pieces are implemented as ribbon conductors.

4. The attenuation element of claim 1, wherein the material with good electrical conductivity is copper.

5. The attenuation element of claim 1, wherein the material with poor electrical conductivity is stainless steel.

* * * * *